(12) United States Patent  
Callicotte et al.

(10) Patent No.: US 7,483,479 B2
(45) Date of Patent: Jan. 27, 2009

(54) SCALED SIGNAL PROCESSING ELEMENTS FOR REDUCED FILTER TAP NOISE

(75) Inventors: Mark Joseph Callicotte, Sacramento, CA (US); Hiroshi Takatori, Sacramento, CA (US)

(73) Assignee: KeyEye Communications, San Jose, CA (US)

( * ) Notice: Subject to any disclaimer, the term of this patent is extended or adjusted under 35 U.S.C. 154(b) by 644 days.

(21) Appl. No.: 10/944,168

(22) Filed: Sep. 16, 2004

(65) Prior Publication Data

US 2006/0056502 A1 Mar. 16, 2006

(51) Int. Cl.
*H03K 5/159* (2006.01)

(52) U.S. Cl. .................. 375/232; 375/233; 375/229; 375/240.04; 375/240.05; 375/240.02; 375/234

(58) Field of Classification Search .......... 375/232, 375/233, 229, 240.05–240.04, 240.02, 234
See application file for complete search history.

(56) References Cited

U.S. PATENT DOCUMENTS

| | | | | |
|---|---|---|---|---|
| 3,732,409 | A | 5/1973 | Fletcher et al. | 235/164 |
| 3,959,637 | A | 5/1976 | Nussbaumer | 235/152 |
| 3,988,606 | A | 10/1976 | Eggermont | 235/156 |
| 4,031,377 | A | 6/1977 | Deutsch et al. | 235/164 |
| 4,322,810 | A | 3/1982 | Nakayama | 364/724 |
| 4,366,547 | A | 12/1982 | Miller | 364/724 |
| 4,691,293 | A | 9/1987 | Conboy | 364/724 |
| 4,782,458 | A | 11/1988 | Bhattacharya et al. | 364/724.16 |
| 4,972,433 | A * | 11/1990 | Yamaguchi et al. | 375/230 |
| 5,146,470 | A | 9/1992 | Fujii et al. | 375/103 |
| 5,230,007 | A | 7/1993 | Baum | 375/14 |
| 5,390,364 | A | 2/1995 | Webster et al. | 455/52.3 |
| 5,530,721 | A * | 6/1996 | Inoue et al. | 375/232 |
| 5,610,909 | A | 3/1997 | Shaw | 370/291 |
| 6,035,320 | A | 3/2000 | Kiriaki et al. | 708/819 |
| 6,366,613 | B2 * | 4/2002 | Sommer et al. | 375/232 |
| 6,469,988 | B1 | 10/2002 | Yang et al. | 370/289 |
| 6,590,931 | B1 | 7/2003 | Wittig | 375/231 |
| 6,934,265 | B2 | 8/2005 | Hara et al. | 370/286 |
| 2002/0061057 | A1 * | 5/2002 | Wakamatsu et al. | 375/152 |
| 2002/0131583 | A1 | 9/2002 | Lu | 379/406.08 |
| 2002/0181575 | A1 * | 12/2002 | Birru | 375/233 |
| 2003/0026329 | A1 * | 2/2003 | Goto | 375/152 |
| 2005/0190832 | A1 | 9/2005 | Ibragimov et al. | 375/233 |

* cited by examiner

*Primary Examiner*—Shuwang Liu
*Assistant Examiner*—Kabir A Timory
(74) *Attorney, Agent, or Firm*—Lument Patent Firm (57) ABSTRACT

An adaptive transversal filter having tap weights $W_j$ which are products of corresponding tap coefficients $C_j$ and tap gains $M_j$ is provided. A filter control loop controls all of the tap coefficients $C_j$ such that an error signal derived from the filter output is minimized. One or more tap control loops controls a tap gain $M_k$ such that the corresponding tap coefficient $C_k$ satisfies a predetermined control condition. For example, $|C_k|$ can be maximized subject to a constraint $|C_k| \leq C_{max}$, where $C_{max}$ is a predetermined maximum coefficient value. In this manner, the effect of quantization noise on the coefficients $C_j$ can be reduced. Multiple tap control loops can be employed, one for each tap. Alternatively, a single tap control loop can be used to control multiple taps by time interleaving.

21 Claims, 5 Drawing Sheets

SCALED SIGNAL PROCESSING ELEMENTS FOR REDUCED FILTER TAP NOISE

FIELD OF THE INVENTION

This invention relates to adaptive filters for signal processing.

BACKGROUND

Present day communication systems typically perform various signal processing functions in order to provide communication. One common signal processing element in communication systems is a filter, which generally provides an output signal y(t) that depends on an input signal x(t). Such filters can be designed to perform various useful functions in a communication system, such as attenuating interfering signals and/or out of band noise. Filtering is well known, and accordingly many filter implementations have been developed. Here we are concerned with transversal filters.

Figure 1:
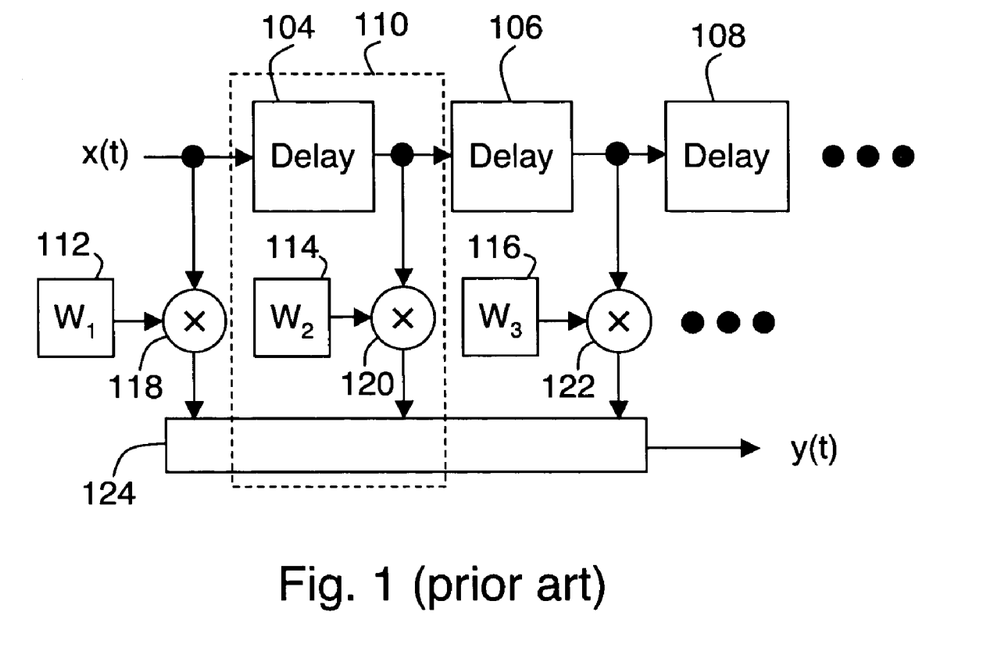
FIG. 1 is a block diagram of a typical prior art transversal filter.

FIG. 1 is a block diagram of a typical prior art transversal filter. In the filter of FIG. 1, the input x(t) is provided to a delay line including time delay elements 104, 106, 108, . . . in succession. If the time delays provided by delay elements 104, 106, 108, . . . are all equal to Td, then the outputs of delay elements 104, 106, . . . are x(t−Td), x(t−2Td), etc. The filter output y(t) is a weighted sum of the values provided by the delay line. This sum is provided by multiple filter taps, one of which is labeled as 110 on FIG. 1. In tap 110, a weight 114 having a value $W_2$ and the output of delay element 104 are provided to a multiplier 120. The output of multiplier 120 is received by a summing junction (or summer) 124 which provides y(t) as an output. Thus, tap 110 provides a term equal to $W_2 x(t-Td)$ in the output y(t). Similarly, weight 112 and multiplier 118 provide a term $W_1 x(t)$ in y(t), and weight 116 and multiplier 122 provide a term $W_3 x(t-2Td)$ in y(t). Transversal filters can have any number of taps. The input-output response of the filter (i.e., the relation between y(t) and x(t)) is determined by the tap weights $W_j$ and the delays provided by the delay line.

Figure 2:
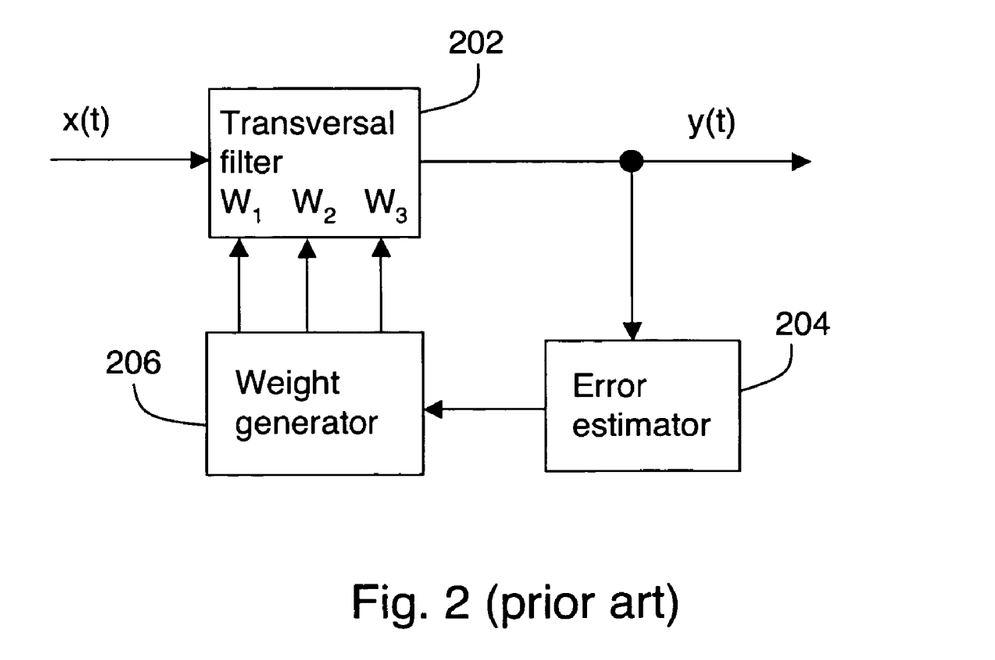
FIG. 2 is a block diagram of a typical prior art adaptive transversal filter.

FIG. 2 shows a typical prior art adaptive transversal filter. On FIG. 2, a transversal filter 202 receives an input x(t) and provides an output y(t). In the example of FIG. 2, filter 202 is a three tap filter having tap weights $W_1$, $W_2$, and $W_3$. The filter output y(t) is also provided to an error estimator 204, which derives an error signal in part from the filter output y(t). Typically, other signals (not shown) are also input to error estimator 204. These other signals, along with y(t), are used to derive the error signal. This error signal is received by a weight generator 206, which controls the weights in filter 202 to minimize the error signal. Thus the arrangement of FIG. 2 functions as a filter control loop that controls the weights $W_j$ in order to minimize the error signal. Transversal filters are particularly suitable for such adaptive filtering, since the output y(t) depends on the weights $W_j$ in a simple manner that facilitates closed loop control.

Such adaptive filtering has found many applications, which primarily differ in the signal that is regarded as the "error signal" to be minimized. For example, in decision feedback equalization, the error signal is an error estimate provided by a slicer that quantizes the filter output y(t) to a set of digital signal levels. In interference cancellation, the error signal to be minimized is the contribution to the output y(t) from an interfering signal z(t). These various alternatives for the error signal to be minimized correspond to delivery of different signals (not shown) to error estimator 204 in addition to filter output y(t).

Adaptive filtering as shown in FIG. 2 is well known, and various modifications of the basic scheme are typically directed toward reducing the computations required for filtering. The multiplication of tap weight and delayed input is of particular interest in the art. For example, U.S. Pat. No. 4,782,458 considers the restriction of tap weights to powers of two, which allows multiplication to be performed by shifting. Similarly, U.S. Pat. No. 4,691,293 considers encoding the filter input in powers of two, which also allows multiplication to be performed by shifting. U.S. Pat. No. 3,959,637 uses delta coding for the tap weights in order to obviate the need for digital multiplication circuits. U.S. Pat. No. 4,031,377 considers multiplication where a floating point factor is approximately expressed as a sum of two terms, the two terms selected to facilitate rapid multiplication by shifting.

However, the conventional arrangement of FIG. 2 has drawbacks that provide room for improvements other than reducing computation time. Consider an example where the tap weights $W_j$ are digital and can vary from −511 u to 512 u, where u is a unit weight. A relatively large tap weight having W on the order of 500 u has a precision of about 0.2%, while a relatively small tap weight having W on the order of 10 u only has a precision of about 10%. Thus, smaller tap weights tend to be less precise than large tap weights. An alternative point of view is to regard +/−1 u as a "quantization noise" which is additive to the tap weights. Such quantization noise has a larger relative impact on small tap weights than on large tap weights in the conventional arrangement of FIG. 2.

Accordingly, it would be an advance in the art to provide adaptive transversal filtering that provides improved precision for relatively low tap weights. It would also be an advance in the art to reduce the impact of quantization noise for relatively small tap weights.

SUMMARY

The present invention provides an adaptive transversal filter having tap weights $W_j$ which are products of corresponding tap coefficients $C_j$ and tap gains $M_j$. A filter control loop controls all of the tap coefficients $C_j$ such that an error signal derived from the filter output is minimized. One or more tap control loops controls a tap gain $M_k$ such that the corresponding tap coefficient $C_k$ satisfies a predetermined control condition. For example, $|C_k|$ can be maximized subject to a constraint $|C_k| \leq C_{max}$, where $C_{max}$ is a predetermined maximum coefficient value. In this manner, the effect of quantization noise on the coefficients $C_j$ can be reduced. Multiple tap control loops can be employed, one for each tap. Alternatively, a single tap control loop can be used to control multiple taps by time interleaving.

DETAILED DESCRIPTION

Figure 3:
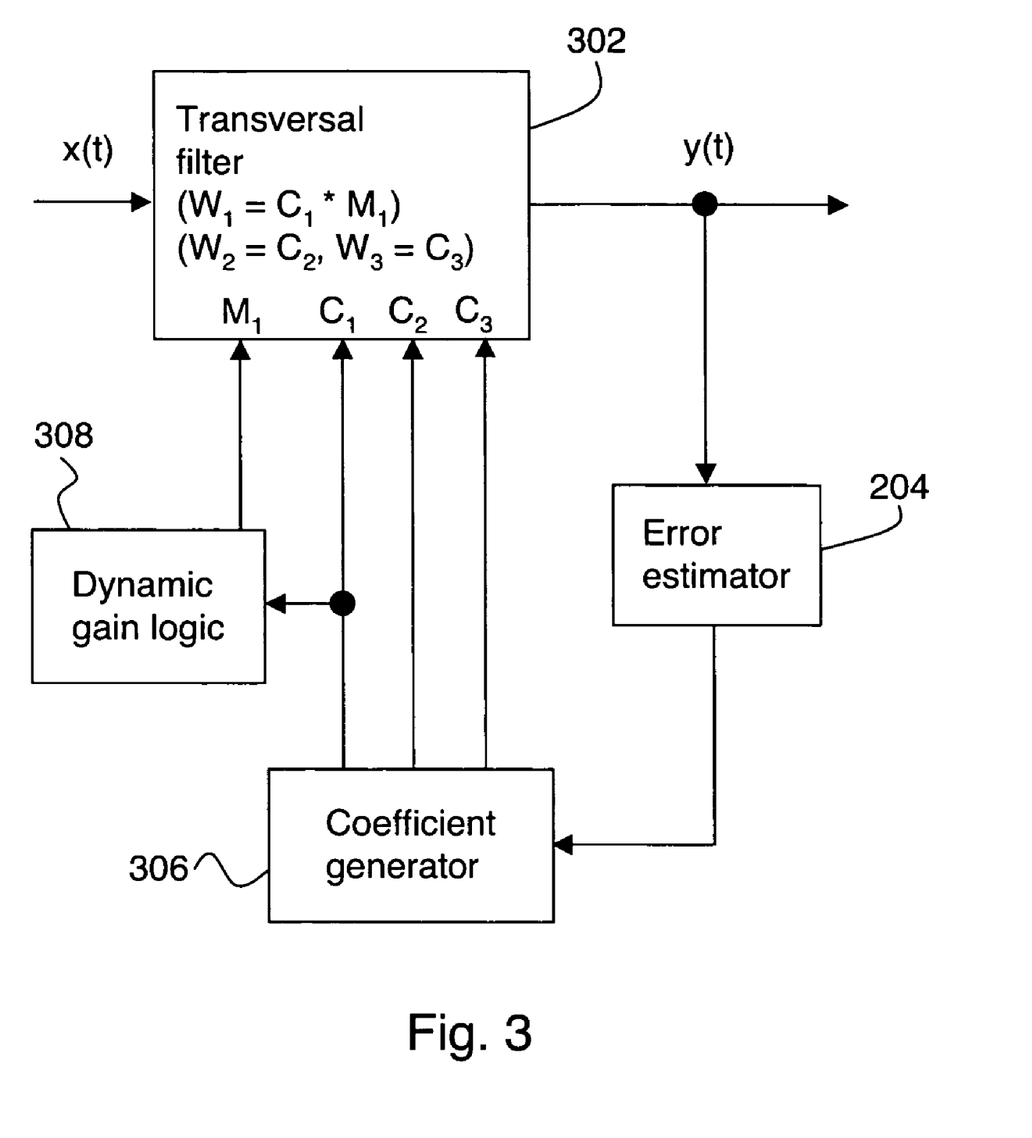
FIG. 3 is a block diagram of an adaptive transversal filter according to an embodiment of the invention.

FIG. 3 shows an adaptive transversal filter according to an embodiment of the invention. On FIG. 3, a transversal filter 302 receives an input x(t) and provides an output y(t). In the example of FIG. 3, transversal filter 302 has N=3 taps having weights $W_j$, where $1 \leq j \leq N$. Weight $W_1$ is expressed as a product of a coefficient $C_1$ and a gain $M_1$. Weights $W_2$ and $W_3$ are equal to coefficients $C_2$ and $C_3$ respectively. Thus the corresponding gains $M_2$ and $M_3$ can be regarded as being set to unity in this example. The filter output y(t) is received by error estimator 204 (as on FIG. 2), which provides an error signal to coefficient generator 306. Coefficient generator 306 provides coefficients $C_1$, $C_2$ and $C_3$ to transversal filter 302. Coefficient $C_1$ is received by dynamic gain logic 308, which provides gain $M_1$ to transversal filter 302.

The operation of the embodiment of FIG. 3 can be regarded as a double control loop. A filter control loop including filter 302, error estimator 204 and coefficient generator 306 controls all tap coefficients (i.e., $C_1$, $C_2$, and $C_3$ in this example) to minimize the error signal provided by estimator 204. As indicated above, one or more other signals (not shown) are typically input to error estimator 204 in addition to y(t) to provide the error signal. Thus the error signal is derived in part from y(t). In addition to this filter control loop, a tap control loop acts on tap 1 and controls gain $M_1$ such that coefficient $C_1$ (as controlled by the filter control loop) satisfies a predetermined control condition. For example, $|C_1|$ can be maximized subject to the constraint $|C_1| \leq C_{max}$, where $C_{max}$ is a predetermined maximum coefficient value.

Consideration of a simple example will show how the configuration of FIG. 3 achieves the objective of reduced quantization noise in adaptive filtering. Suppose the coefficient generator is digital and can provide integer coefficients in the range from −511 to 512. We also take $M_2=M_3=1$ u, and assume $M_1$ can take on a value selected from the set {1 u, u/2, u/4, u/8, u/16, u/32, u/64}. This set of gains can also be regarded as integer multiples of a unit gain $G_0$: {$G_0$, $2G_0$, $4G_0$, $8G_0$, $16G_0$, $32G_0$, $64G_0$}, where $G_0=u/64$. These multiples are powers of two in this example. We also assume the action of the filter control loop causes the filter weights to stabilize at about the following values: $W_1=20$ u, $W_2=20$ u, $W_3=500$ u.

The precision of $W_3$ is about 0.2%, while the precision of $W_2$ is about 5%, which is much worse. Equivalently, it is clear that $W_2$ is much more affected by quantization noise than $W_3$. Even though $W_1$ and $W_2$ have the same numerical values in this example, the precision of $W_1$ can be much better than the precision of $W_2$. Suppose the predetermined control condition on $C_1$ is to maximize its magnitude subject to the constraint $|C_1| \leq 450$ (to provide some dynamic range margin). In this example, the dynamic gain logic 308 can perform a few simple calculations to determine that setting $M_1=u/16$ satisfies the assumed control condition on $C_1$. The resulting value of $C_1$ is 320, which has a precision of about 0.3%. Thus the dynamic gain scaling provided by the tap control loop acting on tap 1 provides greatly improved precision for the $W_1$ tap weight compared to the conventional approach used to provide the $W_2$ tap weight. Note that $C_1$ is controlled by the filter control loop, and automatically assumes its higher value as a result of the inclusion of tap gain $M_1=u/16$ into the filter control loop path pertaining to $C_1$ (and $W_1$).

Such provision of dynamic tap gain is applicable in a wide variety of ways to adaptive transversal filters. For example, only one tap control loop is shown on FIG. 3 for simplicity, but the invention can be practiced with any number of tap control loops. More specifically, if a tap control loop acts on a tap k where $1 \leq k \leq N$, (N being the number of taps) then one or more additional tap control loops can be added, each indexed with a distinct integer n where $1 \leq n \leq N$ and $n \neq k$. Each of these additional loops controls its corresponding tap gain $M_n$ such that its corresponding tap coefficient $C_n$ satisfies a predetermined control condition.

Another variation is the use of a single tap control loop to control multiple tap gains. In many cases, it is reasonable to assume that suitable tap gains do not change greatly from one tap to the next. For example, a tap control loop acting on tap 15 controls tap gain $M_{15}$, and in many cases, it would be more reasonable to set $M_{16}=M_{14}=M_{15}$ directly than to provide separate tap control loops for taps 14 and 16. The range could be extended further (e.g., from $M_{12}$ through $M_{18}$ inclusive), depending on the application. More generally, a tap control loop acting on a tap k can also act on one or more taps m where $m \neq k$ by setting $M_m=M_k$. In such cases, the control condition to apply to $C_k$ is preferably maximization of $|C_k|$ subject to the constraint that $|C_k|$ and all of the $|C_m|$ remain below a predetermined maximum value.

Other variations relate to operation modes of the tap control loops. In some cases, the tap control loops will act on their respective taps to control the corresponding tap gains at substantially all times the filter is operating. In other cases, the tap control loops will only be active during an initialization phase of filter operation, the tap gains $M_j$ being held constant during non-initialization operation. Another alternative is automatically disabling taps having a weight $W_j \leq W_{min}$, where $W_{min}$ is a predetermined minimum weight. Such disabling of taps having small weights can reduce power consumption, decrease noise and/or improve linearity.

Another variant operating mode is based on the expectation that in many cases, the tap gains $M_j$ will not change rapidly in closed loop operation. Therefore, it is possible to use a single tap control loop to individually control multiple taps by time interleaving. More specifically, in a filter having a single tap control loop, the index k designating which tap the tap control loop acts upon can be varied during filter operation. For example, k can cycle repeatedly through all values 1 . . . N where N is the number of taps. When the tap control loop is not acting on a tap, the corresponding tap gain is held constant. If the time interval between updates to the tap gains is smaller than the time scale for significant changes to the tap gains, such time interleaving does not incur a significant performance penalty.

In the example of FIG. 3, it was assumed that the tap control loop forms a difference between $|C_k|$ and $C_{max}$ in order to determine what adjustment to make to $M_k$. In some cases this difference is available, and in other cases this difference is not available. However, a tap control loop having a comparator that provides a two-level output indicating which of $|C_k|$ and $C_{max}$ is larger can also be used in a tap control loop according to the invention, although loop settling is generally faster if the difference between $|C_k|$ and $C_{max}$ is available. In the example of FIG. 3, if we assume $M_k$ has an initial value of 1 u and that the tap control loop has only a comparator, we see that the loop will set $M_k$ to u/2, u/4, u/8, and u/16 in succession, and then $M_k$ will alternate between u/16 and u/32 thereafter. In this example, it is preferable to set $C_{max}$ low enough such that $|C_k| \leq 2 * C_{max}$ is still within the operating range of the circuit, such that this alternation does not cause $C_k$ to go out of bounds. Furthermore, in cases where the loops for controlling $M_k$ are only active during initialization, it is preferable to select the higher $M_k$ of such an alternation as the value to hold fixed once initialization ceases, in order to keep $C_k$ well within the operating range of the circuit.

Figure 4:
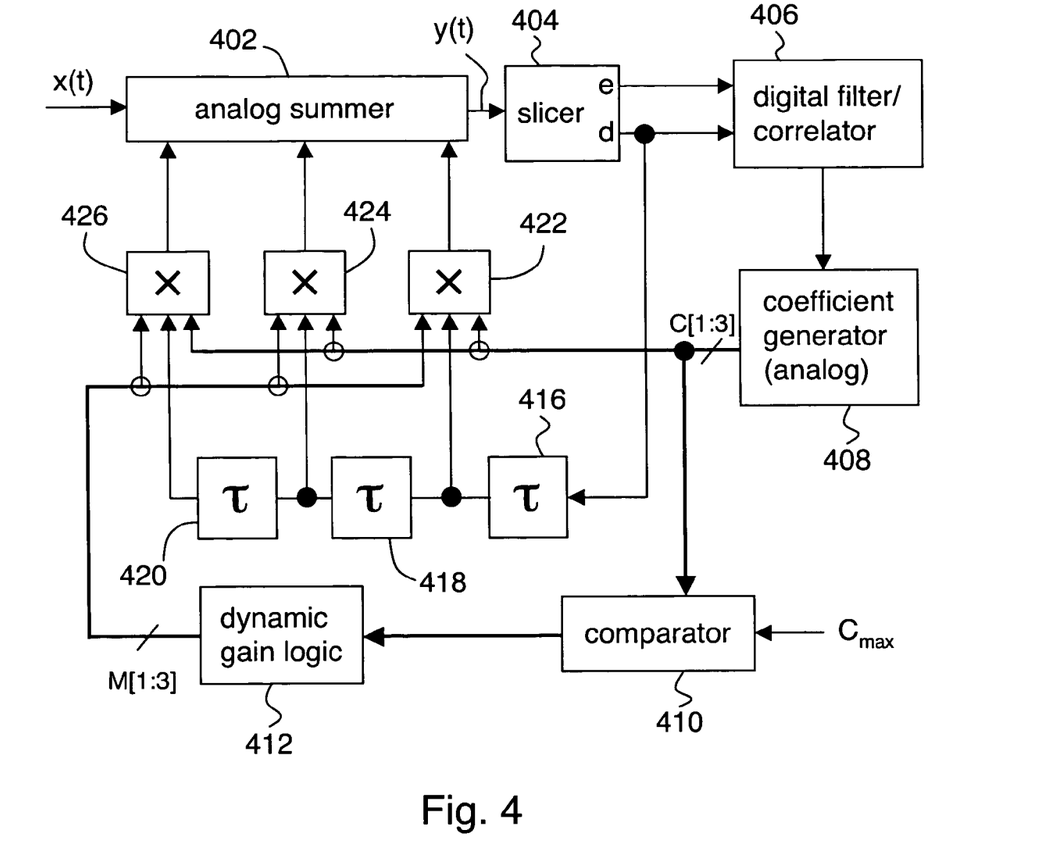
FIG. 4 is a block diagram of a three tap decision feedback equalizer according to an embodiment of the invention.
Figure 5:
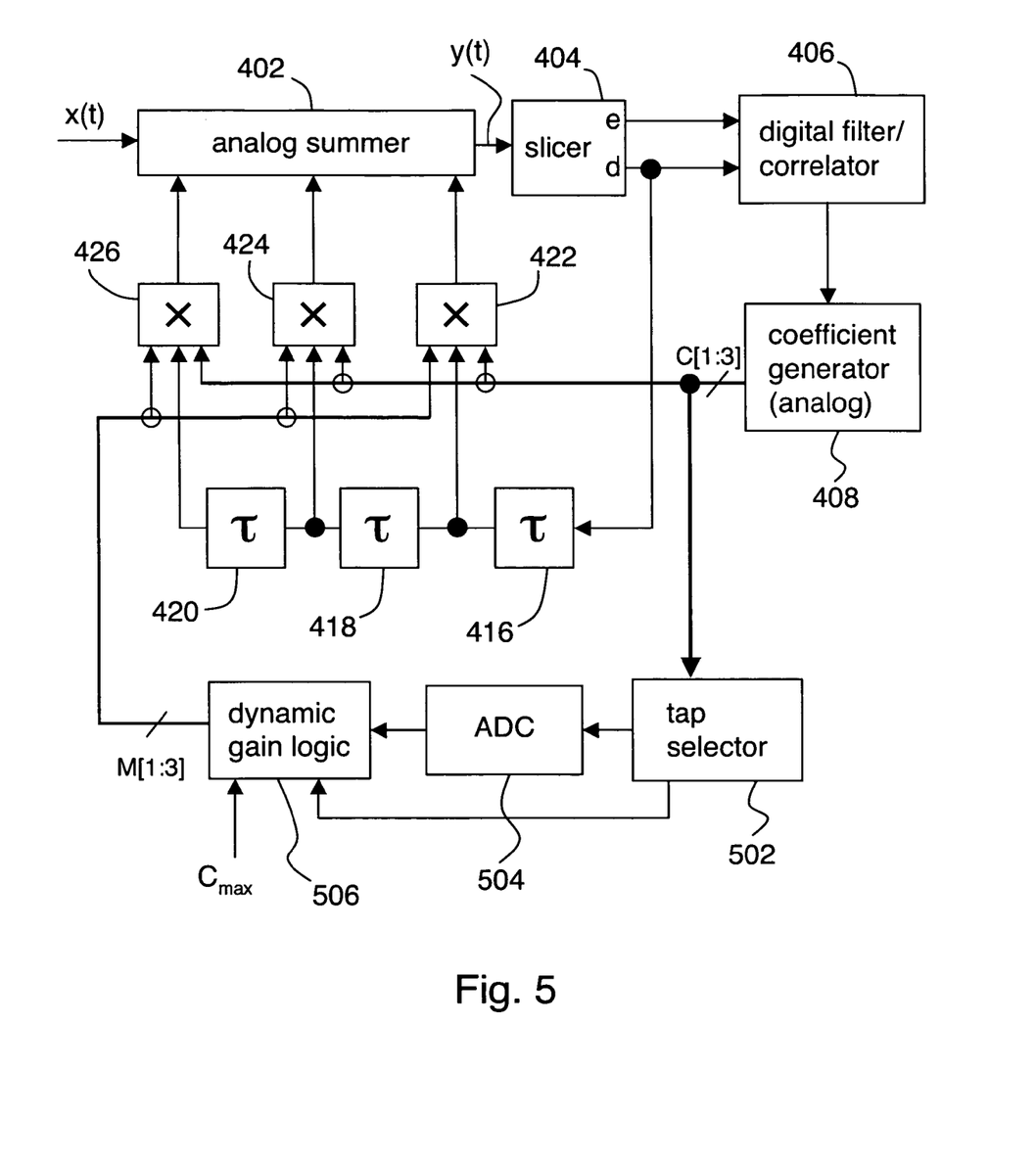
FIG. 5 is a block diagram of a three tap decision feedback equalizer according to another embodiment of the invention.
Figure 6:
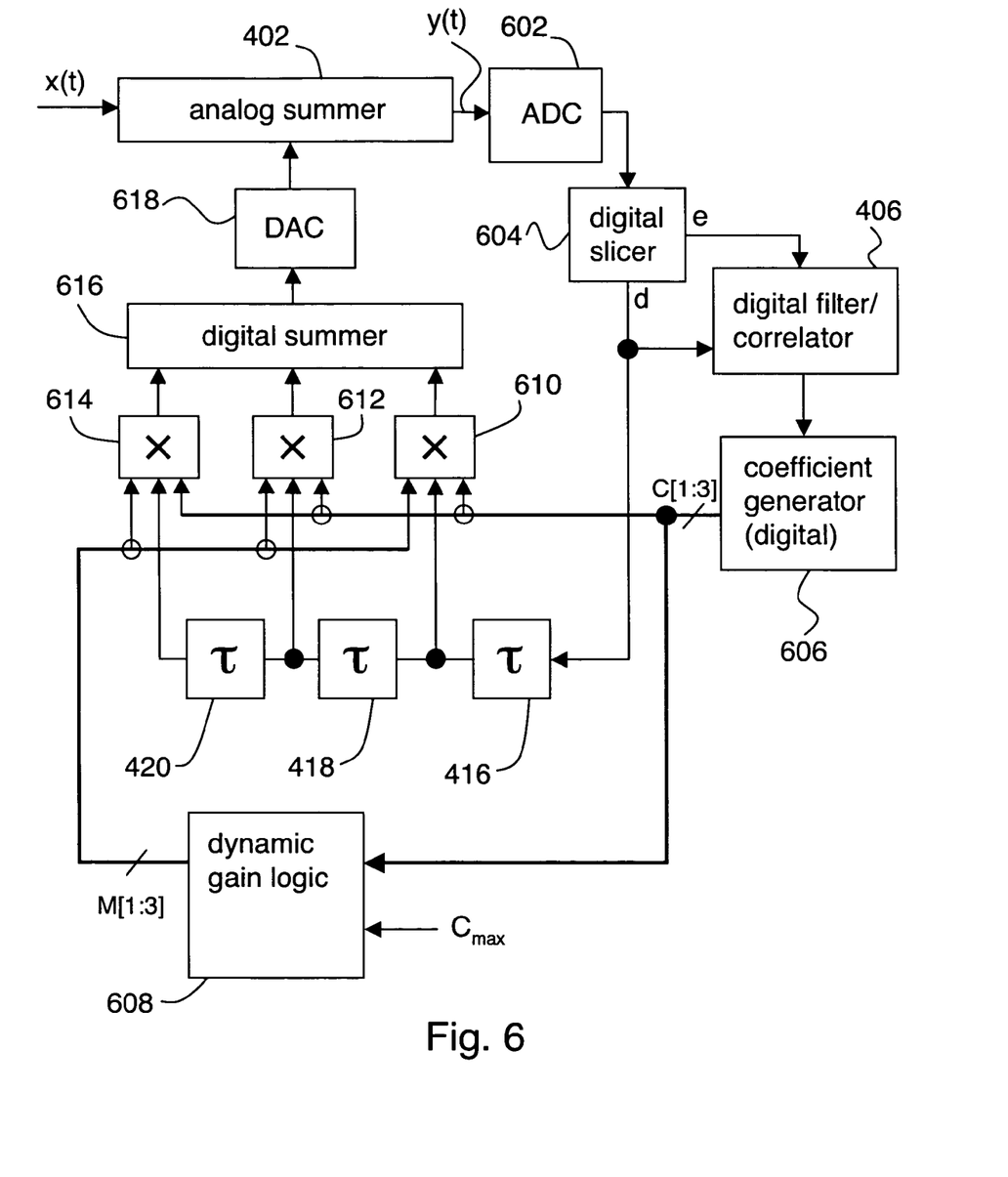
FIG. 6 is a block diagram of a three tap decision feedback equalizer according to yet another embodiment of the invention.

Examples of decision feedback equalizers (DFE) in accordance with embodiments of the invention are shown on FIGS.

4-6. Lines that cross on FIGS. 4-6 are not electrically connected unless there is a dot or a circle at the intersection. A circle is used to indicate a connection to a bus having multiple signals, and buses are shown with heavy lines. FIG. 4 shows a DFE according to an embodiment of the invention. An analog summer 402 receives an external input x(t) and receives inputs from multipliers 422, 424, and 426, and provides an output y(t) (equal to the sum of all inputs) to a slicer 404. Slicer 404 provides a data output "d", or d(t), and an error output "e". The input x(t) is preferably buffered with a buffer (not shown) before summer 402 in order to isolate the DFE from upstream circuitry.

The data signal d(t) is input to an adaptive transversal filter formed by delays 416, 418, and 420, and by multipliers 422, 424, and 426. Note that y(t)=x(t)+f(t), where f(t) is the output of this transversal filter responsive to d(t). Delay elements 416, 418 and 420 provide inputs to multipliers 422, 424, and 426 respectively. Multipliers 422, 424 and 426 receive coefficients $C_1$, $C_2$, and $C_3$ respectively from a coefficient generator 408, and receive tap gains $M_1$, $M_2$ and $M_3$ respectively from a dynamic gain logic 412.

The data and error signals from slicer 404 are received by a digital filter/correlator 406 which filters the data signal and correlates the result to the error signal to provide signals to coefficient generator 408. Coefficient generator 408 provides coefficients $C_1$, $C_2$, and $C_3$ to multipliers 422, 424, and 426 respectively. Digital filter/correlator 406 and coefficient generator 408 are well known in the art. For example, a typical algorithm for this sort of closed loop adaptive filter is called Least-Mean Squared (LMS) filtering.

Coefficients $C_1$, $C_2$, and $C_3$ are also received by a comparator 410, which compares their magnitudes to a predetermined value $C_{max}$ input to comparator 410. The output of comparator 410 is received by dynamic gain logic 412 which controls the tap gains $M_1$, $M_2$, and $M_3$ such that the magnitudes of the corresponding coefficients $C_1$, $C_2$, and $C_3$ are maximized subject to the constraint $|C_j| \leq C_{max}$. Thus the example of FIG. 4 can be regarded as including an adaptive transversal filter of the kind shown on FIG. 3, except that all three taps have dynamically controlled gains on FIG. 4 as opposed to only one tap having a dynamically controlled gain on FIG. 3.

Delay elements 416, 418, and 420 are preferably shift registers. Multipliers 422, 424, and 426 are shown as three-input multipliers, each providing an output proportional to the product of its three inputs. Such three-input multipliers can be implemented in various ways. A single three-input multiplier can be used in cases where a suitable single component is commercially available. A more flexible alternative is the use of two two-input multipliers. For example, a first two-input multiplier can receive $M_k$ and $C_k$ as inputs and provide $W_k$ as an output, and a second two-input multiplier can receive $W_k$ and $d(t-T_k)$ as inputs, and provide $W_k \times d(t-T_k)$ as an output. In this approach, the first multiplier need not be a four quadrant multiplier, since $M_k$ is preferably positive. Generally, inputs and outputs of a multiplier can be either analog or digital in any combination. Two-input multipliers having any combination of analog and/or digital inputs and outputs are known. Thus, provision of three-input multiplication having any combination of analog and/or digital inputs and outputs can be accomplished by appropriately combining two two-input multipliers. For example, a two-input Gilbert cell multiplier can have a digital input and an analog input.

FIG. 5 shows a DFE similar to the DFE of FIG. 4 except for two differences: 1) on FIG. 5 a single time-interleaved control loop is used to control the tap gains; and 2) the tap control loop of FIG. 5 forms a difference between $|C_k|$ and $C_{max}$. More specifically, on FIG. 5 a tap selector 502 selects which of the taps the tap control loop is currently acting on. In typical operation, tap selector 502 will repeatedly cycle through all taps (e.g., 1,2,3,1,2,3, etc.) so that each tap has its gain under active control some of the time. Tap selector 502 provides the selected tap coefficient $C_k$ (as an analog signal) to an analog to digital converter (ADC) 504, which provides a corresponding digital output. The digital output is received by dynamic gain logic 506, which also receives the maximum coefficient value $C_{max}$ as an input. Dynamic gain logic 506 forms the difference between $C_{max}$ and the selected coefficient $|C_k|$ in order to control the corresponding tap gain $M_k$. Tap selector 502 provides an input to gain logic 506 indicating which tap the loop is acting on. Tap gains $M_m$ with $m \neq k$ are held constant while the tap control loop is acting on tap k. In typical operation, the tap gains will change slowly, which allows time interleaving as described without excessive error.

FIG. 6 shows a DFE similar to the DFE of FIG. 4 except that most of the analog circuitry shown on FIG. 4 is replaced with equivalent digital circuitry. Generally, the invention can be practiced with any combination of analog and/or digital circuitry, so the embodiments shown on FIGS. 4 and 6 are by way of example as opposed to limitation. More specifically, on FIG. 6 the output of analog summer 402 is provided to an ADC 602. The digital output of ADC 602 is provided to a digital slicer 604, which provides a quantized digital version of its input to the delay line formed by delay elements 416, 418, and 420.

As on FIG. 4, digital filter/correlator 406 receives data and error signals from slicer 604, and provides signals to a coefficient generator 606. Slicer 604, filter/correlator 406 and coefficient generator 606 can be integrated into a single digital signal processing (DSP) unit, and such integration is preferred for this embodiment. Coefficient generator 606 provides coefficients $C_1$, $C_2$, and $C_3$ as digital values to multipliers 610, 612, and 614, and to dynamic gain logic 608. Gain logic 608 relates the magnitudes of coefficients $C_1$, $C_2$, and $C_3$ to a maximum coefficient value $C_{max}$ (either by simple comparison or by forming a difference) in order to control corresponding tap gains $M_1$, $M_2$, and $M_3$. Note that since $M_k$ tends to have discrete values (u/2, u/4, etc), $C_k$ is not generally set to $C_{max}$ but rather $|C_k|$ ends up having a value near $C_{max}$ due to closed-loop operation. Multipliers 610, 612 and 614 are implemented in digital hardware. The outputs of multipliers 610, 612, and 614 are received by a digital summer 616, which provides its digital output to a DAC 618. DAC 618 provides its analog output to analog summer 402.

In digital embodiments, it is preferable to restrict the tap gains such that they are integer multiples of a unit gain $G_0$, to simplify implementation of multiplication. It is especially advantageous for these integer multiples to be powers of two, such that digital multiplication by the tap gains can be performed with a simple bit shifting operation.

The preceding description provides several examples of embodiments of the invention. Many variations of these examples can also be used to practice the invention. In particular, functions shown in distinct blocks on block diagrams can generally be combined into a single block, and functions shown in a single block can be distributed over multiple blocks, while still practicing the invention. The input to an adaptive filter according to the invention can be analog or digital. In signal processing applications, filters according to the invention are applicable to input signals having any modulation format (e.g., pulse amplitude modulation). The tap gains, tap coefficients and tap delay outputs can each be either analog or digital signals. Mixed mode implementations are also possible, where analog and digital circuitry are both used in different parts of the filter.

For example, in some cases the tap gains are implemented digitally and the tap coefficients are implemented as analog signals, while the tap delays are implemented as digital gates. In this case, multiplication of tap coefficient and tap gain to obtain the tap weight can be performed using relatively slow analog circuitry (e.g., by inputting $C_k$ to a segmented DAC having an output scaled by the gain $M_k$). The resulting analog tap weight $W_k$ can be multiplied by the delayed data with fast analog circuitry (e.g., a Gilbert cell multiplier).

The preceding examples have shown filters with several taps. However, the invention is applicable to transversal filters having any number of taps, including single-tap transversal filters.

What is claimed is:

1. An adaptive transversal filter having an input x(t), the filter comprising:
   a) a set of $N \geq 1$ taps, each tap having a distinct integer index j where $1 \leq j \leq N$, and each tap having a tap weight $W_j$ and a tap delay $T_j$, wherein a filter output is a sum of $W_j x(t-T_j)$ as j runs from 1 to N, wherein each tap weight $W_j$ is a product of a tap coefficient $C_j$ and a tap gain $M_j$;
   b) a filter control loop responsive to said filter output and controlling all of said tap coefficients to minimize an error signal derived in part from said filter output; and
   c) a tap control loop acting on one of said taps having an index k, and responsive to a tap coefficient $C_k$, and controlling a tap gain $M_k$ such that $C_k$ as controlled by said filter control loop satisfies a predetermined control condition;
   wherein said tap coefficient $C_k$ is equal to said tap coefficient $C_j$ if k=j, and wherein said tap gain $M_k$ is equal to said tap gain $M_j$ if k=j;
   wherein said predetermined control condition is maximization of the magnitude of said tap coefficient $C_k$ subject to the constraint $|C_k| \leq C_{max}$, where $C_{max}$ is a predetermined maximum coefficient value.

2. The filter of claim 1, wherein said tap control loop includes a comparator providing a two-valued output indicating which of $|C_k|$ and $C_{max}$ is larger.

3. The filter of claim 1, wherein said tap control loop forms a difference between $|C_k|$ and $C_{max}$.

4. The filter of claim 1, further comprising one or more additional tap control loops, each having a distinct integer index n where $1 \leq n \leq N$ and n≠k, and each responsive to a tap coefficient $C_n$, and each controlling a corresponding tap gain $M_n$ such that $C_n$ as controlled by said filter control loop satisfies a predetermined control condition;
   wherein said tap coefficient $C_n$ is equal to said tap coefficient $C_j$ if n=j, and wherein said tap gain $M_n$ is equal to said tap gain $M_j$ if n=j.

5. The filter of claim 1, wherein said tap control loop acts on one or more of said taps having indices m≠k, and having tap gains $M_m$, by setting said tap gains $M_m$ equal to $M_k$, wherein said tap gain $M_m$ is equal to said tap gain $M_j$ if m=j.

6. The filter of claim 1, wherein said tap control loop operates to control said tap gain $M_k$ at substantially all times said filter is operating.

7. The filter of claim 1, wherein said tap control loop operates to control said tap gain $M_k$ during initialization of said filter, said tap gain $M_k$ being held constant during non-initialization operation.

8. The filter of claim 1, wherein said index k determining which of said taps said tap control loop acts upon is varied during operation of said filter, whereby said tap control loop controls multiple tap gains by time interleaving.

9. The filter of claim 8, wherein said index k takes on all values $1 \leq k \leq N$ during operation, whereby all of said tap gains $M_j$ are controlled by time interleaving.

10. The filter of claim 1, wherein said tap gains $M_j$ are implemented as analog or digital signals.

11. The filter of claim 1, wherein said tap gains $M_j$ are substantially integer multiples of a unit gain $G_0$.

12. The filter of claim 11, wherein said integer multiples are powers of two.

13. The filter of claim 1, wherein said coefficients $C_j$ are implemented as analog or digital signals.

14. The filter of claim 1, wherein said input x(t) is an analog or digital signal.

15. The filter of claim 1, wherein said input x(t) has a pulse amplitude modulation.

16. A signal processing system including an adaptive transversal filter having an input x(t), the filter comprising:
   a) a set of $N \geq 1$ taps, each tap having a distinct integer index j where $1 \leq j \leq N$, and each tap having a tap weight $W_j$ and a tap delay $T_j$, wherein a filter output is a sum of $W_j x(t-T_j)$ as j runs from 1 to N, wherein each tap weight $W_j$ is a product of a tap coefficient $C_j$ and a tap gain $M_j$;
   b) a filter control loop responsive to said filter output and controlling all of said tap coefficients $C_j$ to minimize an error signal derived in part from said filter output; and
   c) a tap control loop acting on one of said taps having an index k, and responsive to a tap coefficient $C_k$, and controlling a tap gain $M_k$ such that $C_k$ as controlled by said filter control loop satisfies a predetermined control condition;
   wherein said tap coefficient $C_k$ is equal to said tap coefficient $C_j$ if k=j, and wherein said tap gain $M_k$ is equal to said tap gain $M_j$ if k=j;
   wherein said predetermined control condition is maximization of the magnitude of said tap coefficient $C_k$ subject to the constraint $|C_k| \leq C_{max}$, where $C_{max}$ is a predetermined maximum coefficient value.

17. The signal processor of claim 16, wherein said signal processor is selected from the group consisting of: echo cancellers, decision feedback equalizers, feed forward equalizers, near end cross talk cancellers and far end cross talk cancellers.

18. The signal processor of claim 16, further comprising one or more additional tap control loops, each having a distinct integer index n where $1 \leq n \leq N$ and n≠k, and each responsive to a tap coefficient $C_n$, and each controlling a corresponding tap gain $M_n$ such that $C_n$ as controlled by said filter control loop satisfies a predetermined control condition;
   wherein said tap coefficient $C_n$ is equal to said tap coefficient $C_j$ if n=j, and wherein said tap gain $M_n$ is equal to said tap gain $M_j$ if n=j.

19. A method for adaptive transversal filtering of an input x(t), the method comprising:
   a) providing a set of $N \geq 1$ taps, each tap having a distinct integer index j where $1 \leq j \leq N$, and each tap having a tap weight $W_j$ and a tap delay $T_j$, wherein a filter output is a sum of $W_j x(t-T_j)$ as j runs from 1 to N, wherein each tap weight $W_j$ is a product of a tap coefficient $C_j$ and a tap gain $M_j$;
   b) controlling all of said tap coefficients $C_j$ to minimize an error signal derived in part from said filter output with a filter control loop responsive to said filter output; and
   c) providing a tap control loop acting on one of said taps having an index k, and responsive to a tap coefficient $C_k$, and controlling a tap gain $M_k$ such that $C_k$ as controlled by said filter control loop satisfies a predetermined control condition;

wherein said tap coefficient $C_k$ is equal to said tap coefficient $C_j$ if k=j, and wherein said tap gain $M_k$ is equal to said tap gain $M_j$ if k=j;

wherein said predetermined control condition is maximization of the magnitude of said tap coefficient $C_k$ subject to the constraint $|C_k| \leq C_{max}$, where $C_{max}$ is a predetermined maximum coefficient value.

20. The method of claim 19, further comprising providing one or more additional tap control loops, each having a distinct integer index n where $1 \leq n \leq N$ and n≠k, and each responsive to a tap coefficient $C_n$, and each controlling a corresponding tap gain $M_n$ such that $C_n$ as controlled by said filter control loop satisfies a predetermined control condition;

wherein said tap coefficient $C_n$ is equal to said tap coefficient $C_j$ if n=j, and wherein said tap gain $M_n$ is equal to said tap gain $M_j$ if n=j.

21. The method of claim 19, further comprising disabling those of said taps having a weight $W_j \leq W_{min}$, where $W_{min}$ is a predetermined minimum weight.

* * * * *